(12) United States Patent
Zaka et al.

(10) Patent No.: US 10,283,584 B2
(45) Date of Patent: May 7, 2019

(54) CAPACITIVE STRUCTURE IN A SEMICONDUCTOR DEVICE HAVING REDUCED CAPACITANCE VARIABILITY

(71) Applicant: GLOBALFOUNDRIES Inc., Grand Cayman (KY)

(72) Inventors: Alban Zaka, Dresden (DE); Ignasi Cortes Mayol, Dresden (DE); Tom Herrmann, Dresden (DE); Andrei Sidelnicov, Dresden (DE); El Mehdi Bazizi, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 8 days.

(21) Appl. No.: 15/277,583

(22) Filed: Sep. 27, 2016

(65) Prior Publication Data
US 2018/0090558 A1    Mar. 29, 2018

(51) Int. Cl.
| H01L 29/78 | (2006.01) |
| H01L 49/02 | (2006.01) |
| H01L 23/535 | (2006.01) |
| H01L 29/94 | (2006.01) |

(52) U.S. Cl.
CPC ............ H01L 28/60 (2013.01); H01L 23/535 (2013.01); H01L 29/94 (2013.01)

(58) Field of Classification Search
CPC ............... H01L 29/1087; H01L 21/761; H01L 29/66181
See application file for complete search history.

(56) References Cited

U.S. PATENT DOCUMENTS

| 6,657,262 B2 * | 12/2003 | Patti .................... H01L 27/0705 257/370 |
| 7,906,383 B2 * | 3/2011 | Richter ........... H01L 21/823412 257/369 |
| 8,264,038 B2 * | 9/2012 | Pendharkar ........... H01L 21/761 257/337 |
| 9,368,487 B1 * | 6/2016 | Su ........................ H01L 27/0248 |
| 9,813,024 B2 * | 11/2017 | Kumar .................. H03F 1/0205 |
| 9,905,707 B1 * | 2/2018 | Sidelnicov .............. H01L 29/94 |
| 2004/0063291 A1 | 4/2004 | Williams et al. |
| 2004/0164354 A1 * | 8/2004 | Mergens ............. H01L 27/0277 257/355 |
| 2008/0197445 A1 * | 8/2008 | Disney .............. H01L 21/76264 257/506 |

(Continued)

OTHER PUBLICATIONS

Examination Report from the Intellectual Property Office for Taiwan Application No. 106128586 dated Jun. 7, 2018.

Primary Examiner — Bradley Smith
Assistant Examiner — David J Goodwin
(74) Attorney, Agent, or Firm — Amerson Law Firm, PLLC

(57) ABSTRACT

A capacitor, such as an N-well capacitor, in a semiconductor device includes a floating semiconductor region, which allows a negative biasing of the channel region of the capacitor while suppressing leakage into the depth of the substrate. In this manner, N-well-based capacitors may be provided in the device level and may have a substantially flat capacitance/voltage characteristic over a moderately wide range of voltages. Consequently, alternating polarity capacitors formed in the metallization system may be replaced by semiconductor-based N-well capacitors.

20 Claims, 4 Drawing Sheets

(56) References Cited

U.S. PATENT DOCUMENTS

| | | | |
|---|---|---|---|
| 2008/0230812 A1* | 9/2008 | Disney | H01L 21/76243 257/272 |
| 2009/0020811 A1* | 1/2009 | Voldman | H01L 29/0619 257/337 |
| 2010/0133583 A1* | 6/2010 | Mawatari | H01L 27/0259 257/173 |
| 2011/0298526 A1 | 12/2011 | Homol et al. | |
| 2012/0181619 A1 | 7/2012 | Yang et al. | |
| 2014/0361367 A1* | 12/2014 | Tseng | H01L 29/1079 257/345 |
| 2015/0041907 A1 | 2/2015 | Lin et al. | |
| 2017/0257088 A1* | 9/2017 | Wu | H01L 27/0262 |
| 2017/0338304 A1* | 11/2017 | Janssens | H01L 21/76224 |

* cited by examiner

CAPACITIVE STRUCTURE IN A SEMICONDUCTOR DEVICE HAVING REDUCED CAPACITANCE VARIABILITY

BACKGROUND OF THE INVENTION

1. Field of the Invention

Generally, the present disclosure relates to semiconductor devices, such as integrated circuits, in which, in addition to active circuit elements, such as transistors and the like, passive circuit elements, and in particular capacitors, also have to be provided in view of superior device performance and/or extending device functionality, for instance, RF applications and the like.

2. Description of the Related Art

Continuous progress has been made in the semiconductor industry, thereby now providing integrated circuits having incorporated therein a very large number of circuit elements, such as transistors and the like. In addition to the transistor elements, which are typically provided in the form of digital switches and/or analog components for controlling voltage and/or currents within the semiconductor device, there is an ongoing development to integrate additional functionality into a single semiconductor device, thereby forming even complete systems on a single chip (SoC). Consequently, passive circuit elements, such as inductors, capacitors and the like, have to be implemented in an increasing number of integrated circuits, in addition to the typically used resistors and capacitors for decoupling and information storage purposes.

For example, many manufacturing strategies have been developed for incorporating capacitive structures into the design of complex integrated circuits, for instance, serving as decoupling capacitors, intended for stabilizing, for instance, the operating voltage, in particular in critical device areas, in which fast switching transistor elements may cause moderately high transient currents. To this end, semiconductor-based capacitor structures, for instance, having one electrode in the active semiconductor material, may be provided at strategically appropriate locations in the semiconductor device so as to reduce supply voltage fluctuations. In other cases, a plurality of capacitors has to be incorporated in order to realize storage areas, such as dynamic RAM areas. In these storage areas, a bit of information is typically stored by using one capacitor and an associated transistor, wherein, in view of achieving a high bit density, the capacitors may typically be provided as deep trench capacitors, which, however, may require additional complex process steps for forming a deep trench and appropriately filling the trench with the conductive and dielectric materials.

When providing capacitive structures in the "device" level of a semiconductor device, i.e., in and on the semiconductor material, which is also used for forming the active circuit elements, such as sophisticated transistors for logic areas in silicon-based integrated circuits relying, for instance, on the well-established CMOS technique, these structures are preferably implemented as NMOS capacitors due to their superior characteristics, for instance, with respect to capacitance/area ratio, frequency response for moderately high frequencies and the like. As a consequence, NMOS capacitors in CMOS integrated circuits have become widely adopted device architecture and, therefore, these NMOS capacitors represent the "standard" capacitor type at device level. For this reason, many appropriate process strategies have been developed and are available for forming such NMOS capacitors along with transistors in the device level.

In recent developments of semiconductor production, not only the critical dimensions of circuit elements, such as the gate length of transistors and the like, have been continuously shrunk, thereby presently arriving at a gate length of 30 nm and significantly less for planar transistor configurations, but also reduced power consumption and increased functionality have been addressed. For example, for time critical signal paths in an integrated circuit, complex gate electrode structures based on high-k dielectric materials in combination with metal-containing electrode materials may frequently be used, thereby reducing, among other things, static gate leakage, while still providing a very low oxide equivalent thickness of the gate dielectric, which is necessary for proper static gate control. In less time critical circuit areas, typically, transistor elements with increased thickness of the gate dielectric material in combination with moderately high supply voltages are used in the device design.

In addition to the general quest for reducing overall power consumption while still maintaining high performance of integrated circuits, there is also an increasing demand for implementing passive circuit areas of increased functionality, for instance, by incorporating RF components, which, in turn, may impart superior connectivity functionality to an integrated circuit. Therefore, increasingly, inductive and capacitive structures are incorporated into the design of integrated circuits, wherein certain requirements are to be met, in particular by the capacitors, with respect to functionality, stability and the like. For instance, in many applications, a capacitor is required to allow operation on the basis of a voltage with alternate polarity, thereby imposing certain constraints on the overall design of the capacitive structure. For example, it is well known that, for a capacitor, such as an NMOS capacitor, formed in the active semiconductor material, for instance, by using appropriately dimensioned and composed "gate electrode structures" including a gate dielectric material as a capacitor dielectric, the resulting capacitance will depend, on the one hand, on the capacitance determined by the distance between the capacitor "plates." Here, the gate electrode material is one electrode of the capacitor and the semiconductor material acts as the second capacitor electrode, wherein these electrodes are separated by the gate dielectric material, which, therefore, defines, at a first glance, the distance of the electrodes. Moreover, the dielectric characteristics of the dielectric material are a further factor determining the capacitance. Despite these structurally determined influences, the capacitance will, on the other hand, significantly vary with the voltage applied to the "gate" electrode structure. That is, similar to the typical transistor functionality, the gate voltage controls the charge carrier distribution in the capacitor body, which is basically a transistor body with appropriately selected lateral dimensions, and, therefore, the effective capacitance of the capacitor is significantly affected by the gate voltage.

With reference to FIGS. 1-3, a typical prior art NMOS capacitor will now be described that is formed on the basis of conventional design concepts so as to provide a capacitive structure in the device level of a semiconductor device.

FIG. 1 schematically illustrates a cross-sectional view of a semiconductor device 100, which, as previously discussed, may comprise a plurality of circuit elements, such as transistors and the like, which, for convenience, are not illustrated in FIG. 1. In addition to these non-depicted circuit elements, the device 100 comprises a capacitive structure 150 that is formed in and on a semiconductor material 101, which is typically provided as a silicon substrate. In accordance with typical standards in the semiconductor industry, the substrate 101 may represent a P-doped substrate material. It should be appreciated that the substrate 101 may extend along a depth direction, i.e., in FIG. 1, a vertical direction pointing to the bottom of FIG. 1, so as to have a thickness of, for instance, several hundred micrometers.

An isolation structure 102, such as a trench isolation structure, for example, a shallow trench isolation (STI), is formed in a surface layer of the substrate 101 and thus laterally defines the dimensions of the capacitive structure 150 in accordance with overall design requirements. The isolation structure 102 may also be provided in the form of a locally oxidized isolation region, depending on the overall process strategies used for forming the semiconductor device 100. A vertical extension of the isolation structure 102 into the depth of the substrate 101 may depend on the process strategy used. Within the area laterally defined by the isolation structure 102, there is provided an N-doped semiconductor region 103, which may also be referred to as an N-well. The semiconductor region 103 may, therefore, typically have a dopant profile similar to any other circuit elements, such as transistors, which require an N-well doping. As discussed above, N-well capacitors have become a preferred option for capacitive structures that are formed based on a semiconductor material due to superior characteristics in terms of frequency response and generally increased capacitance/area ratio.

Moreover, in the semiconductor region 103, are an appropriate number of highly doped semiconductor regions, which may also be referred to as contact structures, individually indicated by contact structures 110A, 110B and 110C or commonly indicated as contact structures 110. The contact structures 110 may comprise an appropriate contact metal, which is indicated in FIG. 1 as 112A, 112B, 112C and which is connected to a contact pad or terminal, here symbolically represented by a line 114. It should be appreciated that, except for the highly doped semiconductor regions 111A, 111B, 111C (collectively referred to as highly doped semiconductor regions 111), any other components of the contact structures 110A, 110B, 110C are to be understood as symbolic representations, which do not reflect the actual implementation. For example, respective metal-containing regions may be formed so as to be in contact with the highly doped semiconductor regions 111 based on well-established contact regimes, as are also to be applied for any other circuit elements, such as transistors and the like.

Moreover, electrode structures 120A, 120B (collectively referred to as electrode structures 120) are formed on the basis of materials and process strategies which are also compatible with the manufacturing process for forming gate electrode structures of transistor elements. That is, except for the lateral dimensions, the electrode structures 120 may basically have the same configuration as any gate electrode structures, including a dielectric layer 123, which is formed on the semiconductor region 103 and which represents the dielectric material of the capacitive structure 150. Depending on the degree of sophistication of the semiconductor device 100, the dielectric layer 123 may be comprised of dielectric materials, such as silicon dioxide, silicon nitride, silicon oxynitride, high-k dielectric materials, or any combination thereof. Similarly, the physical thickness and the equivalent oxide thickness may basically correspond to the analogous characteristics of gate electrode structures for at least one type of transistors to be provided in the semiconductor device 100. Also, an electrode material 121A, 121B, which may represent any appropriate conductive material that is compatible with the overall design and process strategy of the device 100 is formed on the dielectric material 123 in combination with an appropriate sidewall spacer structure 122A, 122B. The electrode structures 120, when appropriately electrically connected to each other by any appropriate interconnection regime, schematically indicated by a line 124, may thus represent one electrode of the capacitive structure 150. With respect to the material composition of the electrode materials 121A, 121B, it is to be noted that, also in this case, a configuration is typically used that is compatible with at least one type of transistor gate electrodes, and, therefore, highly doped polysilicon, amorphous silicon, metal-containing work function metals and metal-containing material layers may be implemented in the electrode materials 121A, 121B, depending on the overall process and device requirements.

Upon operating the capacitive structure 150, a voltage may be applied between the electrode structures 120 and the substrate 101, which is typically at ground potential, thereby forming a second electrode structure of the capacitive structure 150. Consequently, for a given voltage, that is, for a given "gate" voltage, the charge carrier distribution in the region 103 will depend on this voltage. Since one contribution to the resulting capacitance of the structure 150 is the charge carrier distribution, such as width of a space charge region, presence of a conductive channel at the interface and the like, and a further contribution stems from constructive criteria, i.e., the thickness and type of the dielectric layer 123 and the lateral dimensions thereof, a pronounced dependency of the effective capacitance on the applied voltage is observed. Consequently, for a substantially constant voltage applied across the capacitive structure 150, a substantially constant capacitance may be obtained. As discussed above, preferably in the industry, an N-well capacitive structure is used due to the increased capacitance/area ratio compared to P-well based capacitors. In the example illustrated in FIG. 1, a "depletion-type" structure is presented, wherein the highly doped regions 111 and the N-well region 103 have the same conductivity type.

As discussed above, there is an increasing demand for capacitors in semiconductor devices, which have to provide a substantially constant capacitance over a certain range of voltages applied to the capacitor. For example, implementing a more or less complete system on a single chip with RF functionality may require capacitors that have to operate at varying voltages or even at voltages of alternate polarity, which renders the capacitive structure 150 less than desirable for the following reasons.

FIG. 2 illustrates a graph 200 that depicts the progression of the capacitance of the capacitive structure 150 for a varying "gate" voltage, i.e., a voltage applied to the line 124, connecting the "gate" electrode structures and a terminal connected to the substrate 101. In FIG. 2, a range of voltages 201 is shown, for which it is desired to have a substantially constant capacitance. On the other hand, curve 202 illustrates qualitatively the variation of the capacitance within the range 201. In the present example, a required width of the range 201 corresponds to −3.3 to +3.3V. As is evident from FIG. 2, the capacitance for the structure 150 as shown in FIG. 1 has a moderately high capacitance at a voltage of 3.3V and higher due to charge carrier accumulation in the vicinity of the dielectric layer 123. For zero voltage, however, a significant drop of the capacitance may be observed, which may result in a minimum capacitance at the voltage of −3.3 V and less, which in total may result in a drop of more than 50% across the desired voltage range 201. Since such a significant variation of the capacitance is considered inappropriate for applications requiring a substantially constant capacitance, alternative approaches have been applied.

To this end, frequently, capacitive structures may be implemented in the metallization system of the semiconductor device 100 (not shown), which typically comprises a plurality of metallization layers including conductive lines, such as aluminum lines, copper lines and the like, which are separated by an appropriate dielectric material in each layer. Moreover, the individual layers of the plurality of stacked metallization layers are typically connected by so-called vias, which are also embedded in an appropriate dielectric material, thereby enabling a highly complex wiring system for connecting the circuit elements in the device level with contact pads, which may finally be used for connecting the semiconductor device 100 with the periphery. Typically, capacitive structures provided in the metallization system have to be formed by interdigitized metal lines for both capacitor electrodes, thereby requiring a specific connection regime between the individual electrode fingers and the plurality of metallization layers across which the respective capacitive structure is distributed. As a consequence, complex processing may be required and, in particular, a complex metallization system has to be provided in order to implement the capacitive structure that allows a voltage-independent operation of the capacitor and in particular offers the potential for using alternate polarity voltages. Moreover, positioning of respective capacitive structures that are formed in the metallization system is restricted to specific areas within the metallization system and thus reduces design flexibility. That is, typically, vertical offset and horizontal offset of the position of such capacitors is required with respect to a desired design position in the device level, which may unduly affect the overall efficiency of the capacitor.

On the other hand, shifting the working point of the capacitive structure 150 so as to obtain a substantially flat behavior of the capacitance across the desired voltage range is not a desirable option, as will be discussed with reference to FIG. 3.

FIG. 3 illustrates a graph 300, in which curve 302B substantially corresponds to the curve 202 of FIG. 2, while curve 302A represents the dependency of the capacitance on the voltage after biasing the contact structures 110, i.e., the line 114 (see FIG. 1). It appears that one would obtain the desired substantially flat capacitance/voltage behavior. However, applying such a regime to the capacitive structure 150 would lead to a biasing of the respective PN junction between the region 103 and the substrate 101, which is still on ground potential. As a consequence, due to driving the PN junction into or near the conductive state renders this option less than desirable due to pronounced leakage.

In view of the situation described above, the present disclosure therefore relates to techniques in which a capacitive structure may exhibit desired capacitance/voltage behavior with significantly reduced variation, thereby avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides a capacitive structure and a method of operating the same in which the capacitive structure may be provided in the device level along with any other semiconductor-based circuit elements, such as transistors, on the basis of a desired type of conductivity in the "channel region" of the capacitor, which, in illustrative embodiments, may be provided on the basis of an N-well doping. To this end, an appropriate stack of semiconductor regions having appropriate conductivity types may be positioned so as to ensure a high degree of isolation of the capacitive structure towards the substrate material, thereby suppressing leakage to ground by efficiently avoiding a direct biasing of a respective PN junction. For example, in illustrative embodiments, a floating, i.e., non-contactable semiconductor region, may electrically isolate a "channel region" of the capacitive structure form an underlying well region, which in turn may provide isolation to the substrate material.

One illustrative embodiment disclosed herein relates to a capacitive structure. The capacitive structure includes a dielectric region formed on a portion of the first doped semiconductor region that has a first conductivity type. Moreover, an electrode structure is formed on the dielectric region. The capacitive structure further includes a second doped semiconductor region that is formed below the first doped semiconductor region and has the first conductivity type. The capacitive structure further includes a third doped semiconductor region positioned, in a depth direction, between the first and second doped semiconductor regions so as to delineate the first doped semiconductor region in the depth direction, wherein the third doped semiconductor region has a second conductivity type that is inverse to the first conductivity type. Furthermore, the capacitive structure includes a doped substrate having the second conductivity type, wherein the doped substrate is separated from the first and third semiconductor regions by the second semiconductor region.

A further illustrative embodiment disclosed herein relates to a capacitive structure. The capacitive structure includes a floating semiconductor region of P-conductivity formed below a first semiconductor region of N-conductivity. The floating semiconductor region isolates the first semiconductor region from a second semiconductor region of N-conductivity. Moreover, the capacitive structure includes a substrate material of P-conductivity that is in contact with the second semiconductor region. Furthermore, a dielectric layer is formed on a portion of the first semiconductor region and an electrode structure is formed on the dielectric layer.

A further illustrative embodiment disclosed herein relates to a method of operating a capacitive structure of a semiconductor device. In the method, the capacitive structure includes a floating semiconductor region of P-conductivity formed below a first semiconductor region of N-conductivity, wherein the floating semiconductor region isolates the first semiconductor region from a second semiconductor region of N-conductivity. Moreover, the capacitive structure includes a substrate material of P-conductivity that is in contact with the second semiconductor region. A dielectric layer is formed on the first semiconductor region and an electrode structure is formed on the dielectric layer. Based on this capacitive structure, the method includes applying a negative bias voltage to the first semiconductor region. Moreover, the method includes using the electrode structure as a first capacitor electrode and at least one of the second semiconductor region and the substrate as a second capacitor electrode.

BRIEF DESCRIPTION OF THE DRAWINGS

The disclosure may be understood by reference to the following description taken in conjunction with the accompanying drawings, in which like reference numerals identify like elements, and in which.

Figure 1:
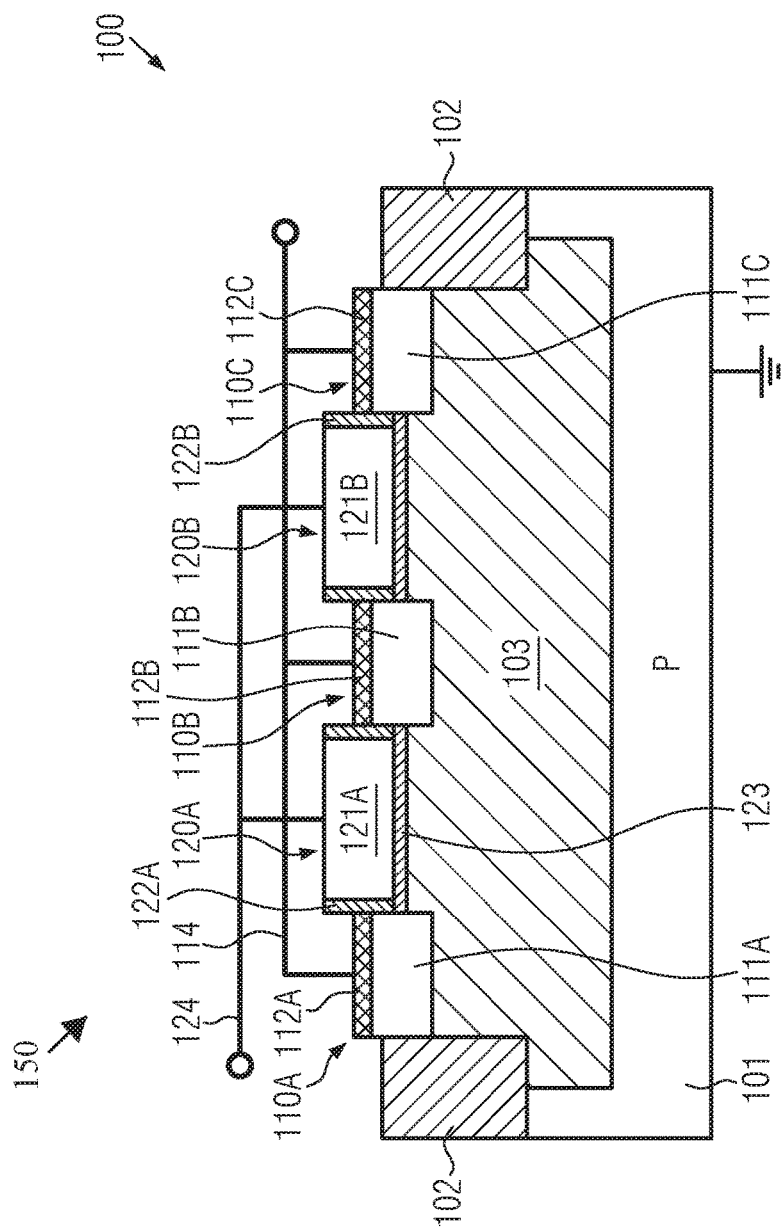
FIG. 1 schematically illustrates a cross-sectional view of a conventional prior art capacitor design on the basis of an N-well.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless or otherwise indicated, all numbers expressing quantities, ratios and numerical properties of ingredients, reaction conditions and so forth used in the specification and claims are to be understood as being modified in all instances by the term "about."

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Illustrative embodiments of the present disclosure are based on the finding that an appropriately doped, dimensioned and positioned semiconductor region may allow an efficient isolation from a substrate material, which is typically tied to ground potential, thereby avoiding an undesired direct biasing of the corresponding PN junction that is typically formed in a conventional N-well-based capacitor. Consequently, the semiconductor region in contact with the capacitor dielectric, also referred to as the capacitor "body" or "channel" may be biased so as to appropriately shift the working point. The appropriately shifted working point of the capacitive structure provides the possibility to significantly reduce the capacitance/voltage variation across a desired range of voltages applied to the capacitive structure. In particular, the functionality of a capacitor with alternate polarity may be established, which may be operated so as to have a required reduced variability in capacitance across a specified voltage range. To this end, a stack of doped regions including at least one floating semiconductor region may be provided so as to particularly isolate an overlying semiconductor region or capacitor channel that is in contact with the capacitor dielectric towards the substrate material.

In this respect, it should be appreciated that any positional information or statements are to be understood as indicating the position or direction of a region or element with reference to the substrate material of a semiconductor device. In this sense, a "vertical" direction or "depth" direction is to be understood as a direction that is substantially orthogonal to a surface area, in and above which circuit elements, such as transistors and the like, are formed. More precisely, the depth direction is a vertical direction that points into the substrate and thus points to a substrate surface that is opposite to the surface area in and on which semiconductor-based circuit elements are formed. Consequently, a first layer or region being positioned "below" or "under" a second region or layer is to be understood as a region or layer that is closer with its uppermost edge to the second substrate surface, i.e., the surface opposite to the active semiconductor material representing the surface area in and on which the circuit elements are formed. In a similar manner, terms such as "above," "over" and the like are to be understood as indicating a positional relationship along the depth direction or the vertical direction, in which the distance with respect to the second substrate surface increases. In an analogous manner, terms such as "horizontal," "lateral" and the like are to be understood as indicating a direction or position that is substantially parallel to any one of the substrate surfaces.

Figure 4:
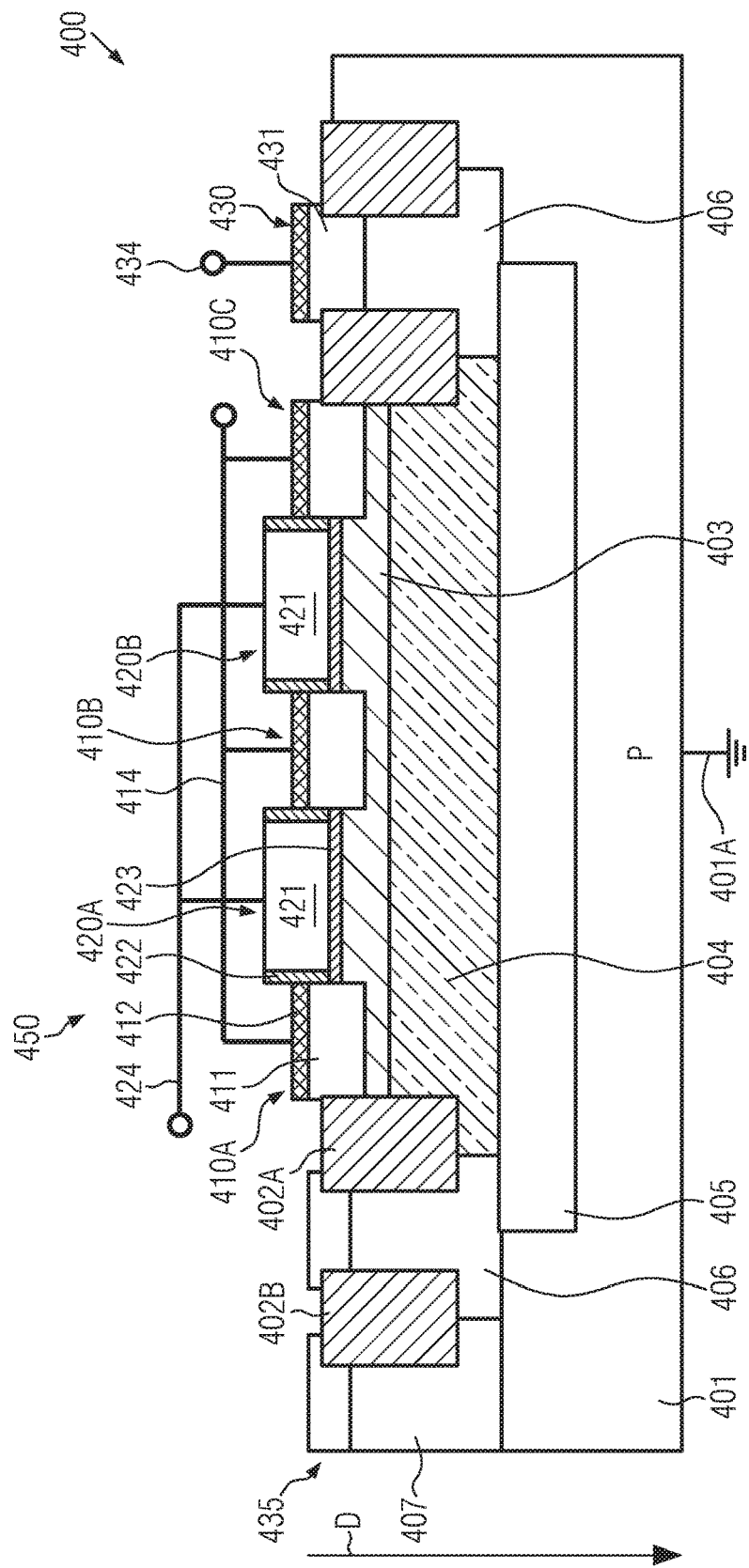
FIG. 4 schematically illustrates a cross-sectional view of a capacitive structure with reduced variability of the capacitance/voltage behavior according to illustrative embodiments of the present disclosure.
Figure 5:
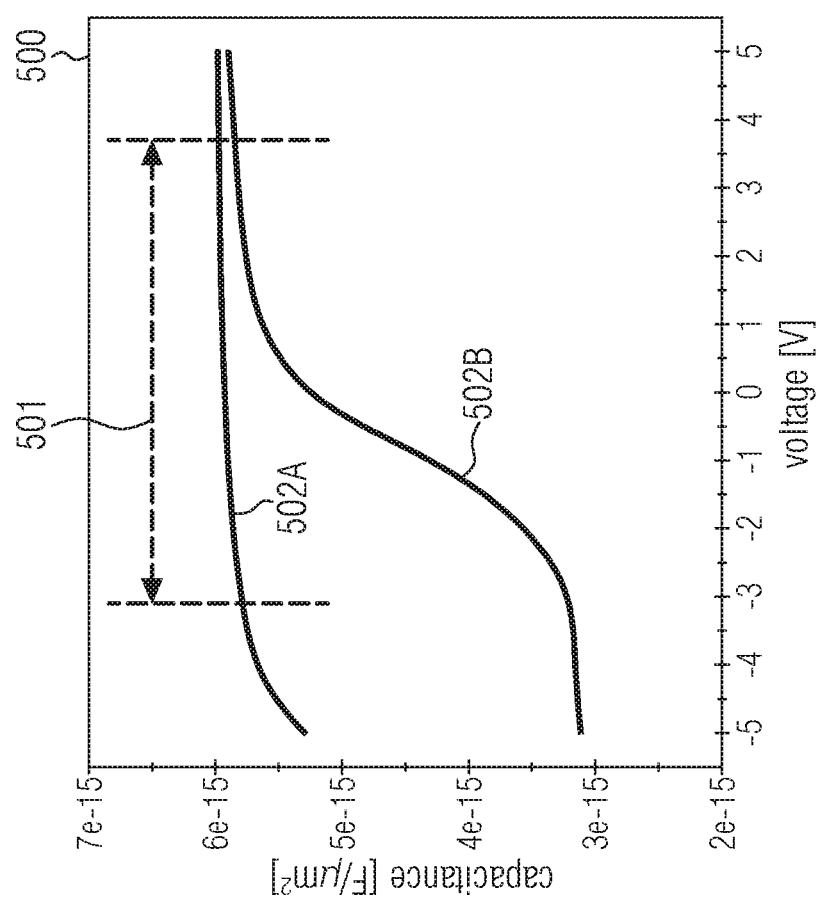
FIG. 5 illustrates a graph that shows the difference in the capacitance/voltage behavior for a biased and non-biased state of the capacitive structure of FIG. 4 according to illustrative embodiments.

With reference to FIGS. 4 and 5 further illustrative embodiments will now be described.

FIG. 4 schematically illustrates a cross-sectional view of a semiconductor device 400, which may basically comprise an appropriate number of circuit elements, such as transistors, resistors and the like, as required for achieving the functionality of the circuit design under consideration. For convenience, any such additional circuit elements of the device 400 are not shown in FIG. 4. The device 400 comprises a capacitive structure 450, which may have a configuration that allows the operation of the structure 450 such that a desired capacitance/voltage behavior may be achieved, as will be discussed later on in more detail. To this end, the capacitive structure 450 may comprise a substrate material 401, which is to be understood as any appropriate semiconductor material that is appropriate for forming thereon and therein the circuit elements as required in the device 400. In illustrative embodiments, the substrate 401 may comprise a silicon-based semiconductor material, while, in other cases, any other appropriate semiconductor material, such as silicon/germanium, silicon/carbon and the like, may be used. In illustrative embodiments, the substrate material 401 may comprise a specific dopant profile so as to impart a certain type of conductivity to the material 401. In one illustrative embodiment, the substrate material 401 is to be understood as a P-substrate material, i.e., a material having P-conductivity. That is, basically the concentration of P-dopant species is higher than a concentration of any N-dopant species. It should further be appreciated that the substrate material 401, which may also be referred to as substrate, may itself represent a semiconductor layer formed on a carrier material, such as a semiconductor material or an insulating material, if such a semiconductor-on-insulator (SOI) configuration is considered appropriate. Therefore, the substrate material 401 may have an extension along a depth direction D, i.e., the vertical direction in FIG. 4, which may range from several hundred nanometers to several hundred micrometers, depending on the overall device requirements, wherein an additional carrier material may be provided below the substrate material 401.

Moreover, a first semiconductor region 403, which in illustrative embodiments may be doped so as to have a desired conductivity type (in one illustrative embodiment, the conductivity type is an N-type conductivity) may be formed in a surface area of the substrate material 401. The surface area of the substrate material may generally be referred to as an active semiconductor layer, in and on which further circuit elements, in particular transistor elements, may be provided. The lateral dimensions of the semiconductor region 403 may be defined by an isolation structure 402A, such as a trench isolation, an isolation structure obtained by local oxidation and the like, as is also previously discussed with reference to FIG. 1. Moreover, one or more dielectric layers 423 of one or more electrode structures 420, in the example shown, two electrode structures 420A, 420B, may be formed on the semiconductor region 403 with lateral dimensions in accordance with overall design and device requirements for the capacitive structure 450.

As already discussed above, the dielectric layer 423 may have any configuration and composition as is deemed appropriate for the specific semiconductor device 400. For example, sophisticated high-k dielectric materials and/or other "conventional" dielectric materials may be used, such as silicon dioxide, silicon nitride, silicon oxynitride or any combination thereof, in order to comply with the overall device requirements. Similarly, the physical thickness and the equivalent oxide thickness of the dielectric layers 423 may be selected so as to obtain the desired capacitive coupling between the semiconductor region 403 and the electrode structures 420A, 420B. In some illustrative embodiments, the physical thickness of the dielectric layer 423 may be 7 nm or less. The electrode structures 420 may be composed of any desired material. For example, the electrode structures 420 may have a similar configuration, except for the lateral dimensions, as the gate electrode structures of at least one type of transistors to be formed in combination with the capacitive structure 450. For example, an electrode material 421 may comprise "conventional" conductive materials, such as polysilicon and/or amorphous silicon, and/or more sophisticated metal-containing materials, for instance conductive materials containing titanium, tantalum and the like, possibly in combination with appropriate work function species and the like. The electrode materials 421 may be laterally confined by an appropriate spacer structure 422 having a configuration and material composition as required for the processing of other circuit elements. The one or more electrode structures 420 may be connected to a terminal (not shown) so as to allow the application of a desired potential, wherein any such connection is symbolically represented by a line 424.

Moreover, one or more contact structures 410 may be formed so as to connect to the semiconductor region 403, wherein a symbolic line 414 may represent any interconnect structure as required for connecting the contact structures 410 with a desired potential, which may also be referred to herein as a biasing potential. The contact structures 410, in the embodiment shown in FIG. 4 three contact structures 410A, 410B, 410C are provided, however, any other number of contact structures may be implemented, if considered appropriate, may have a configuration, as is already discussed above with reference to FIG. 1. That is, a heavily doped semiconductor material 411, in the embodiment shown, an N-doped semiconductor material, may be provided so as to connect to the semiconductor region 403. Moreover, any appropriate highly conductive material, such as a metal-containing material 412 may be provided, which in turn may finally be connected to any appropriate terminal (not shown) so as to allow the application of the biasing potential to the contact structures 410 and thus to the semiconductor region 403. It should be appreciated that, in other illustrative embodiments, the heavily doped regions 411 may have P-conductivity, if considered appropriate.

Below the semiconductor region 403, a doped semiconductor region 404 may be provided, wherein the conductivity type of the region 404 may be inverse to the conductivity type of the region 403. In one illustrative embodiment the semiconductor region 404 has P-conductivity. Furthermore, as illustrated, the semiconductor region 404 may at least partially be delineated in the lateral directions by the isolation structure 402A. Consequently, since the regions 403 and 404 are in contact to each other, a PN junction is formed, thereby effectively electrically isolating the region 403 with respect to any regions formed below the semiconductor region 404. Vertically adjacent to the region 404 there is formed a further doped semiconductor region 405 having a conductivity type that is inverse to the conductivity type of the semiconductor region 404. Hence, in one illustrative embodiment, the semiconductor region 405 has P-conductivity.

As discussed above, the term "below" or "under" is to be understood so that, in the depth direction D, a distance between the region 404 and the substrate material 401 is less than a distance between the region 403 and the substrate material 401. Furthermore, in some illustrative embodiments, the semiconductor region 404 may represent a floating or non-contactable semiconductor region, since it may at least partially be delineated in the lateral directions by the isolation structure 402A and may form a PN junction with any other surrounding inversely doped semiconductor regions. That is, due to the PN junction formed between the regions 403 and 404 and due to the PN junctions formed between the semiconductor region 404, on the one hand, and the semiconductor region 405 and a semiconductor region 406 having the same conductivity type as the region 405, on the other hand, the region 403 is effectively electrically isolated from the substrate material 401. In other words, the semiconductor region 405 may have the opposite type of conductivity compared to the substrate material 401 and, therefore, provides isolation of the region 404 and hence of the region 403 with respect to the substrate material 401, since the lateral dimensions of the region 405 are greater than the lateral dimensions of the semiconductor region 404.

Moreover, a further contact structure 430 may be provided so as to connect to the semiconductor region 405 via the semiconductor region 406, thereby enabling the application of a desired voltage to the region 405, if considered appropriate for the operation of the capacitive structure 450. The contact structure 430 may comprise a highly doped semiconductor region 431, which may be of the same conductivity type as the conductivity type of the regions 405 and 406 so that electrical connection between a terminal 434 and the region 405 may be established. With respect to the terminal or line 434, it is again to be understood that this is a symbolic representation of any interconnect structure connecting the highly doped semiconductor material 431 with a terminal, for instance, provided in or above a corresponding metallization system (not shown).

The contact structure 430 may be laterally isolated from a contact structure 435 that is appropriately designed so as to connect to the substrate material 401, thereby enabling a connection of the material 401 with a desired potential, in illustrative embodiments, ground potential 401A. To this end, the contact structure 435 may comprise a highly doped semiconductor material of the same conductivity type as the substrate material 401 in combination with a P-type semiconductor material 407 that finally connects to the substrate material 401. It should be appreciated that the lateral isolation of the contact structures 430 from the contact structure 435 and, thus, from the substrate material 401 may be achieved by the respective PN junctions formed between the interfaces of these materials. Similarly, the isolation structures 430 are isolated from the floating region 404 by respective PN junctions formed at the interface of these regions.

The semiconductor device 400 as illustrated in FIG. 4 may be formed on the basis of the following process sequence.

After providing a substrate including the substrate material 401, which may represent any appropriate semiconductor material for forming therein the individual circuit elements of the device 400, the manufacturing process may continue, depending on the overall strategy, for instance, by forming the isolation structures 402A, 402B, by well-established strategies including, for instance, forming appropriate hardmask layers, such as layers of oxide, nitride and the like, and patterning the same on the basis of well-established lithography and etch techniques. In other cases, prior to forming the isolation structures 402A, 402B, other process steps may be performed, such as the growth of semiconductor material by epitaxial growth techniques and the like, at least in some areas of the semiconductor device 400 in accordance with the overall requirements. For example, strain characteristics, charge carrier mobility and the like may be locally adapted by depositing one or more different semiconductor materials in certain device areas. In other cases, any such processes for defining specific semiconductor characteristics may be performed after the formation of the isolation structures 402A, 402B.

For example, in some cases, specific semiconductor regions with a desired conductivity type and dopant profile may be formed by depositing a doped semiconductor material and the like. In still further cases, a desired dopant profile may be established within the substrate material 401 by appropriate sequences of implantation processes, during which typically the well regions of respective transistor elements are also formed. For example, during such implantation processes, an appropriate lithography mask may be formed so as to expose the lateral area for the semiconductor region 405, which may, therefore, correspond to an implantation sequence, in which deep well regions of respective transistors are obtained, such as power transistors to be operated at elevated voltages and/or currents and the like.

In the illustrative embodiment shown in FIG. 4, the respective deep well implantation results in an N-doped region that thus provides for electrical isolation to the substrate material 401. Similarly, the floating semiconductor region 404 may be formed on the basis of a well implantation sequence during which any standard P-wells for respective transistor elements are provided. To this end, the respective masking regime is appropriately adapted so as to expose during the corresponding implantation process the lateral area of the region 404. Consequently, in illustrative embodiments, no additional masking and patterning process may be required for obtaining the floating semiconductor region 404.

Similarly, during the formation of N-well regions for transistor elements, a corresponding masking regime may be applied so as to allow the introduction of the respective dopant species, thereby forming the semiconductor region 406 that is connected to the contact structure 430 still to be formed. It should be appreciated that, if a desired conductivity type for the semiconductor region 403 may not be obtained during the sequences for implanting the dopant species for the regions 406 and the regions 404, i.e., during the process sequence for forming well regions of P-type and N-type transistors, a further implantation process, possibly on the basis of an additional lithography mask, may be performed. In other embodiments, the process parameters of the well doping processes are adapted so as to obtain a remaining net doping in the region 403, such as an N-doping. In other illustrative embodiments, a P-dopant species may be incorporated into the region 404 and/or and N-dopant species, if necessary, may be incorporated into the region 403. That is, in illustrative embodiments, an N-conductivity may be established for the region 403 on the basis of the previously performed well implantation processes for P-wells and N-wells, while, in other cases, additional dopant species may be incorporated by an additional masked implantation step.

As a consequence, the stack of semiconductor regions for providing a capacitor "plate" on the one hand, and for ensuring sufficient isolation to the grounded substrate material 401 on the other hand, may be accomplished on the basis of standard well implantation sequences using a correspondingly adapted masking regime, while, if required, an additional implantation process may be applied.

Next, the electrode structures 420 including the dielectric layers 423 may be formed according to the process strategies as required for the formation of transistor elements in other areas of the semiconductor device 400. For example, the dielectric layer 423 may be formed together with the dielectric material of gate electrode structures of at least one type of transistors to be provided in the semiconductor device 400. To this end, any well-established process strategy may be applied. For example, the formation of the dielectric layers 423 may involve deposition and/or oxidation techniques, depending on the type of dielectric material to be formed, such as "conventional" dielectric materials possibly in combination with sophisticated high-k dielectric materials, while, in other cases, basically a placeholder gate electrode structure may be formed, wherein sophisticated dielectric materials may be formed in a very late manufacturing stage.

Thereafter, appropriate conductive materials, which are also used for gate electrode structures, may be deposited and patterned on the basis of well-established process strategies, wherein the lateral dimensions of the "gate" electrode structures 420 are defined by the respective requirements for the capacitive structure 450. After the patterning of the electrode structures 420, the further processing may continue in accordance with typical transistor formation processes, for instance, by depositing and patterning dielectric materials for the spacer structures 422 in combination with respective implantation sequences for forming highly doped drain and source regions, thereby also forming the highly doped semiconductor regions 411, 431, and the highly doped semiconductor material in the contact structure 435 that connects to the substrate material 401. Also in this case, the differently doped areas in the capacitive structure 450 may be obtained during the process sequence for forming highly doped drain and source regions of complementary transistors. It should be appreciated that appropriate anneal processes may be performed at any appropriate manufacturing stage in order to activate the respective dopants and re-crystallize implantation-induced damage.

In illustrative embodiments, highly doped regions, such as the drain and source regions and the semiconductor regions 411, 431 and the highly doped semiconductor material in the contact structure 435, may be formed, in addition to using implantation techniques or as an alternative to implantation techniques, on the basis of an in situ doping epitaxy process, wherein a device architecture with raised drain and source regions may be established. That is, in some illustrative embodiments, the highly doped semiconductor material for the regions 431, 411 and for the contact structure 435 may be deposited on the basis of an epitaxial growth process, in which an appropriate concentration of dopant species may be incorporated into the deposition atmosphere so as to deposit a highly doped semiconductor material. If required, respective areas may previously be recessed so as to obtain a desired "depth" of the highly doped semiconductor regions. In some illustrative embodiments, the epitaxial growth process may be performed such that the finally obtained surface of the highly doped semiconductor materials of the regions 411, 431 is above a level of that corresponding to the interface of the dielectric region 423 with the material of the region 403. Such a configuration will be referred to as an architecture including raised drain and source regions, as typically such a raised configuration is also obtained in corresponding transistor elements.

In some illustrative embodiments, the highly doped semiconductor material in these regions may be formed so as to extend 10-30 nm above the substrate level, i.e., the level of the interface formed by the dielectric region 423 and the semiconductor material of the region 403. The growth ambient for the epitaxial growth may be adjusted such that a doping level between $5\times10^{19}$ and $5\times10^{21}$ cm$^{-3}$, that is, $5\times10^{19}$ and $5\times10^{21}$ dopant atoms per cubic centimeter, may be obtained in the highly doped semiconductor regions. To this end, dopant species such as phosphorus and boron may be used for N-type and P-type regions, respectively, when forming the epitaxially grown highly doped semiconductor regions.

Thereafter, the processing may be continued by forming an appropriate contact level, such as depositing one or more dielectric materials, forming contact openings therein and filling these openings with any appropriate conductive material. Thereafter, a metallization system may be formed so as to comply with the overall wiring requirements of the device 400. During the formation of the contact level and the metallization system, the wiring for the symbolic lines 424, 434 and 414 may also be established.

Consequently, the capacitive structure 450 may be formed on the basis of well-established process strategies, in some illustrative embodiments, without requiring any additional process steps and without substantial variations of process recipes, except for a modification of one or more lithography masks, while, in other cases, only a small number of additional process steps may have be applied, thereby ensuring substantially no or only a very moderate increase in overall process complexity.

Figures 2, 3:
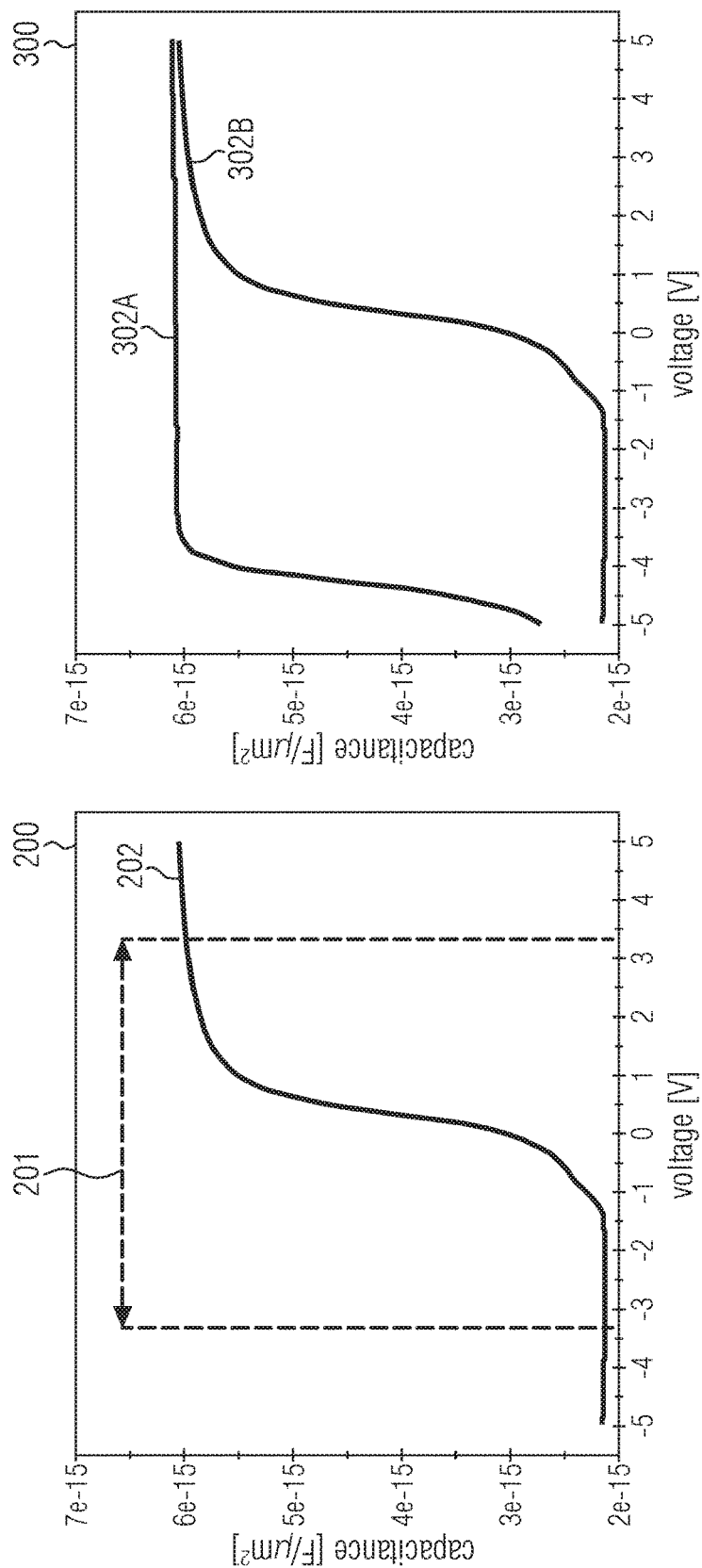
FIG. 2 illustrates a graph showing the variation of the capacitance of the conventional prior art capacitor design with respect to a capacitor voltage.
FIG. 3 illustrates a graph depicting the shift of the capacitance/voltage dependence of the conventional prior art capacitor design upon applying an appropriate bias voltage.

Upon operating the capacitive structure 450, the one or more electrode structures 420 may be used as one capacitor electrode, while the semiconductor region 405, i.e., the contact structure 430, and/or the substrate 401, i.e., the contact structure 435, may be used as the other capacitor electrode. If a capacitance/voltage behavior of reduced variation for a specific range of capacitor voltages may be required, a biasing voltage may be applied to the semiconductor region 403 by means of the contact structures 410 in order to appropriately shift the working point of the capacitive structure 450, as already discussed above with reference to FIG. 3. However, a significantly different behavior may be obtained due to the effective isolation of the region 403, as will be explained below.

FIG. 5 shows a graph 500 in which a curve 502B illustrates the dependency of a capacitance on the capacitor voltage, i.e., the potential applied to the electrode structures 420, when substantially no bias voltage is applied to the contact structure 410. It should be appreciated that at least the substrate material 401 is at ground potential 401A. As is evident from FIG. 5, a corresponding reduced variation of the capacitance of the capacitive structure 450 may be obtained for a voltage applied to the electrode structure 420 in the range of approximately 0.5-5.0 V and higher. When, on the other hand, a negative bias voltage of, for example, −5 V is applied to the contact structure 410 and therefore to the region 403, the working point is shifted to the left in FIG. 5. Therefore, a reduced variation of the capacitance/voltage behavior may be obtained over a relatively wide range of capacitor voltages. For example, in one illustrative embodiment, the capacitive structure may be adjusted so as to be operable with alternate polarity in the range of ±4.0 V, wherein a variation of the capacitance is approximately 5% or less. As discussed, this may be accomplished, for a given constructive configuration of the capacitive structure 450, by appropriately adjusting the negative bias voltage. In a further illustrative embodiment, the bias voltage is adjusted such that, for voltages applied in the range of ±3.3V, a variation of 3% or less of the capacitance may be obtained.

As a result, the present disclosure provides a capacitive structure and a method of operating the same wherein a capacitor based on an N-well configuration may be efficiently operated so as to exhibit a reduced capacitance/voltage behavior over a specified voltage range. To this end, the semiconductor region that is in contact with the capacitor dielectric material may be efficiently isolated towards the substrate material by incorporating, in one illustrative embodiment, a floating or non-contactable semiconductor region, which follows the biasing potential, thereby substantially preventing any leakage into the depth of the semiconductor device by means of a further semiconductor region that is positioned below the floating semiconductor region.

At the same time, the potential is kept at a high value in the vicinity of the isolated semiconductor region, i.e., the capacitor channel.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A capacitive structure, comprising:
   a dielectric region formed on a portion of a first doped semiconductor region having a first conductivity type;
   an electrode structure formed on said dielectric region;
   a second doped semiconductor region formed below said first doped semiconductor region and having said first conductivity type;
   a third doped semiconductor region positioned, in a depth direction, between said first and second doped semiconductor regions so as to delineate said first doped semiconductor region in said depth direction, said third doped semiconductor region having a second conductivity type that is inverse to said first conductivity type;
   a doped substrate having said second conductivity type and being separated from said first and third semiconductor regions by said second semiconductor region; and
   a first contact structure directly contacting said first doped semiconductor region.

2. The capacitive structure of claim 1, further comprising a second contact structure connected to said second doped semiconductor region.

3. The capacitive structure of claim 2, wherein said electrode structure and said first and second contact structures are formed above a same side of said doped substrate.

4. The capacitive structure of claim 3, further comprising a substrate contact structure connected to said doped substrate, wherein said substrate contact structure and said first and second contact structures are formed above said same side of said doped substrate.

5. The capacitive structure of claim 2, wherein said first and second contact structures comprise highly doped semiconductor regions in the form of epitaxially grown in situ doped raised semiconductor material.

6. The capacitive structure of claim 5, wherein said epitaxially grown in situ doped raised semiconductor material extends approximately 10-30 nm above an interface formed by said dielectric region and said first doped semiconductor region with a dopant concentration of approximately $5\times10^{19}$ to $5\times10^{21}$ cm$^{-3}$.

7. The capacitive structure of claim 1, wherein said third doped semiconductor region is a non-contactable semiconductor region.

8. The capacitive structure of claim 1, wherein at least one further dielectric region is formed on a second portion of said first doped semiconductor region so as to be laterally separated from said dielectric region.

9. The capacitive structure according to claim 1, wherein said first conductivity type is an N-conductivity type.

10. The capacitive structure of claim 1, wherein said first contact structure comprises a highly doped semiconductor region having the first conductivity type.

11. A capacitive structure, comprising:
    a floating semiconductor region of P-conductivity formed below a first semiconductor region of N-conductivity, said floating semiconductor region isolating said first semiconductor region of N-conductivity from a second semiconductor region of N-conductivity;
    a substrate material of P-conductivity in contact with said second semiconductor region;
    a dielectric layer formed on a portion of said first semiconductor region;
    an electrode structure formed on said dielectric layer; and
    a first contact structure directly contacting said first semiconductor region.

12. The capacitive structure of claim 11, further comprising a second contact structure connected to said second semiconductor region.

13. The capacitive structure of claim 12, wherein said first and second contact structures comprise highly doped semiconductor regions in the form of epitaxially grown in situ doped raised semiconductor material.

14. The capacitive structure of claim 13, wherein said epitaxially grown in situ doped raised semiconductor material extends approximately 10-30 nm above an interface formed by said dielectric region and said first doped semiconductor region with a dopant concentration of approximately $5\times10^{19}$ to $5\times10^{21}$ cm$^{-3}$.

15. The capacitive structure of claim 11, further comprising a substrate contact structure connected to said substrate material.

16. The capacitive structure of claim 11, wherein at least one further dielectric region is formed on a second portion of said first semiconductor region so as to be laterally separated from said dielectric region and wherein a further electrode structure is formed on said further dielectric layer.

17. The capacitive structure of claim 11, wherein said first contact structure comprises a highly doped semiconductor region having N-type conductivity.

18. A method of operating a capacitive structure of a semiconductor device, said capacitive structure comprising:
    a floating semiconductor region of P-conductivity formed below a first semiconductor region of N-conductivity, said floating semiconductor region isolating said first semiconductor region from a second semiconductor region of N-conductivity;
    a substrate material of P-conductivity in contact with said second semiconductor region;
    a dielectric layer formed on said first semiconductor region;
    an electrode structure formed on said dielectric layer; and
    a first contact structure directly contacting said first semiconductor region;
    said method comprising:
    applying a negative bias voltage to said first contact structure; and
    using said electrode structure as a first capacitor electrode and at least one of said second semiconductor region and said substrate as a second capacitor electrode.

19. The method of claim 18, further comprising adjusting said bias voltage so as to obtain a capacitance variation of 5 percent or less for a capacitor voltage applied to said first and second capacitor electrodes that varies between ±4 Volt.

20. The method of claim 19, wherein said bias voltage is adjusted so as to maintain said capacitance variation at 3 percent or less for a capacitor voltage that varies between ±3.3 Volt.

* * * * *